(12) United States Patent
Eriguchi et al.

(10) Patent No.: US 7,432,556 B2
(45) Date of Patent: Oct. 7, 2008

(54) SEMICONDUCTOR DEVICE WITH DUMMY CONDUCTORS

(75) Inventors: Koji Eriguchi, Ritto (JP); Susumu Matsumoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/620,976

(22) Filed: Jan. 8, 2007

(65) Prior Publication Data

US 2007/0108614 A1 May 17, 2007

Related U.S. Application Data

(62) Division of application No. 10/859,921, filed on Jun. 2, 2004, now abandoned.

(30) Foreign Application Priority Data

Jun. 3, 2003 (JP) ............... 2003-158478
Jun. 3, 2003 (JP) ............... 2003-158479

(51) Int. Cl.
*H01L 23/52* (2006.01)
(52) U.S. Cl. ............... 257/356; 257/758; 257/E23.142
(58) Field of Classification Search ............... 257/758, 257/356, E23.142, E23.145; 438/926
See application file for complete search history.

(56) References Cited

U.S. PATENT DOCUMENTS

| 6,078,074 | A | 6/2000 | Takebuchi et al. |
| 6,559,485 | B2 | 5/2003 | Aoyama |
| 6,717,209 | B1 | 4/2004 | Kim et al. |
| 6,717,267 | B1 | 4/2004 | Kunikiyo |
| 2001/0039079 | A1 | 11/2001 | Shin |

FOREIGN PATENT DOCUMENTS

| JP | 10-173157 | 6/1998 |
| JP | 11-74523 | 3/1999 |

*Primary Examiner*—Matthew C Landau
(74) *Attorney, Agent, or Firm*—Hamre, Schumann, Mueller & Larson, P.C.

(57) ABSTRACT

At least a laminate of a gate insulating film 6 and a gate electrode 7 and an active region 13 are formed on a silicon substrate 1, and an underlying interlayer insulating film 10 is further formed. Then, a conductor 11a connected to the gate electrode 7, and a conductor 11b that is a dummy conductor and is connected to the active region 13 are formed simultaneously on the underlying interlayer insulating film 10. Thereafter, an interlayer insulating film 12 is formed on the underlying interlayer insulating film 10 by a plasma process. At this time, charging current from a plasma 14 is emitted through the conductor 11b, which is a dummy conductor.

6 Claims, 12 Drawing Sheets

US 7,432,556 B2

SEMICONDUCTOR DEVICE WITH DUMMY CONDUCTORS

CROSS-REFERENCE TO RELATED APPLICATIONS

This application is a Division of application Ser. No. 10/859,921, filed Jun. 2, 2004, which application is incorporated herein by reference

TECHNICAL FIELD

The present invention relates to a semiconductor device and a method for manufacturing the same.

BACKGROUND ART

In recent years, in a semiconductor device constituted by semiconductor integrated circuits, high integration has undergone great development. In particular, in semiconductor devices of MIS (metal insulated semiconductor) type, miniaturization and high performance of elements such as transistors have been promoted in order to cope with high integration, and there is a demand for further miniaturization and high performance.

In a process for forming conductors of such a semiconductor device, plasma processing including plasma CVD or plasma etching has been increasingly utilized. This is because in the process for forming conductors of a semiconductor device, there is a limitation regarding the amount to be subjected to heat treatment because of diffusion of impurities, the heat resistance of a metal material for conductors and the like, and the amount to be subjected to heat treatment can be reduced by the plasma process.

Furthermore, in recent years, copper (Cu) conductor may be introduced for further high performance, and a damascene method is used to form copper (Cu) conductors. In this case, the plasma process is utilized increasingly.

Thus, the plasma process is used, not only for etching but also for forming a film, and utilization of the plasma process tends to be increased year by year. However, with the increased utilization of the plasma process, device damage due to the plasma process tends to occur. This is generally called "plasma charging damage", and has gained attention recently.

In a semiconductor device that is subjected to such plasma charging damage, the device characteristics are deteriorated, so that the semiconductor device is defective. In the problem of plasma charging damage, in particular, deterioration in the reliability of gate insulating films constitutes a serious problem.

Hereinafter, plasma charging damage will be described with reference to FIGS. 11 and 12. FIG. 11 shows partial cross-sectional views of a configuration of a conventional semiconductor device. FIG. 11A is a cross-sectional view taken along the normal direction of a semiconductor substrate constituting a semiconductor device, and FIG. 11B is a cross-sectional view taken along a line C-C' shown in FIG. 11A.

As shown in FIG. 11A, the conventional device includes an n-type silicon substrate 21. In the silicon substrate 21, a plurality of element separations 22 are formed so as to be exposed on the silicon substrate 21 at a predetermined interval by a STI (Shallow Trench Isolation) method.

Between the element separations 22 on the silicon substrate 21, an n-channel MOS transistor is formed with a p-well 23 formed in the internal portion of the silicon substrate 21, a gate insulating film (film thickness: 2.2 nm) 26, a gate electrode 27 formed of n+ polysilicon, and a source (n+) region 24a and drain (n+) region 24b provided in a surface layer portion of the silicon substrate 21.

The gate insulating film 26 and the gate electrode 27 are formed so as to be aligned with each other, and in the opposite side faces thereof, a side wall (side face protective film) 28 is formed so as to cover the opposite side faces. Reference numeral 25 is an n+ region and is an active region that serves as a source region or a drain region of another transistor.

Furthermore, an underlying interlayer insulating film 30 and an interlayer insulating film 32 are laminated sequentially on the silicon substrate 21 to realize multilayer wiring. Conductors 31a to 31c are formed in the underlying interlayer insulating film 30. The conductors 31a to 31c are copper conductors (thickness: 500 nm) formed by the damascene method and embedded in the underlying interlayer insulating film 30.

The conductor 31a is a conductor for gate electrode connection that is connected to the gate electrode 27 via a W (tungsten) plug 29b. The conductor 31c is a conductor for source and drain connection that is connected to the n+ region 25 via a W (tungsten) plug 29a. The conductors 31a and 31c are formed in a strip shape, as shown in FIG. 11B.

The W plugs 29a and 29b are formed by filling contact holes formed in the underlying interlayer insulating film 30 with tungsten. The W plug 29a is formed so as to be connected to the n+ region 25, and the W plug 29b is formed so as to be connected to the gate electrode 27.

The conductor 31b is a dummy conductor for ensuring smoothness in the CMP (chemical mechanical polishing) process performed in the damascene method, and is formed adjacent to the conductor 31a. As shown in FIG. 11B, for the conductor 31b, a plurality of conductors are provided and each is formed in a square shape. The conductor 31b is insulated by the underlying interlayer insulating film 30 and the interlayer insulating film 32 at its entire circumference and thus is electrically suspended.

FIG. 12 is a cross-sectional view showing a process for forming the interlayer insulating film in the conventional semiconductor device shown in FIG. 11, showing schematically the occurrence of plasma charging damage.

First, the gate insulating film 26 is formed on the silicon substrate 21 provided with the element separation 22 and the p-well 23. Then, the gate electrode 27 is formed on the gate insulating film 26, and the side wall 28 is formed on the opposite side faces of the gate insulating film 26 and the gate electrode 27. Then, the n+ region 25, the source (n+) region 24a and the drain (n+) region 24b are formed by ion implantation to form the underlying interlayer insulating film 30.

Then, the W plugs 29a and 29b are formed in the underlying insulating film 30, and then the conductors 31a to 31c are formed simultaneously. More specifically, trenches are formed in the positions in which the conductors 31a to 31c are to be provided in the underlying interlayer insulating film 30, and copper layers are formed so as to fill the trenches. Thereafter, excess thickness is removed by polishing according to the CMP method.

Then, as shown in FIG. 12, a plasma 33 is generated by a plasma CVD apparatus (not shown) so that the interlayer insulating film 32 is formed. In this case, the conductor 31b is electrically suspended, as described above, and the conductor 31c is connected directly to the silicon substrate 21, so that the charging current from the plasma 33 flows into the gate electrode 27 and the gate insulating film 26. Therefore, the gate insulating film 26 is damaged and thus the device characteristics are damaged.

In order to solve such a problem, JP10-173157A discloses a semiconductor device in which a protection diode connected to the gate electrode is provided on a semiconductor substrate. In the semiconductor device disclosed in JP10-173157A, the charging current that causes plasma charging damage flows off to the ground potential via the protection diode. Therefore, the charging current is suppressed from being applied to the gate insulating film, so that the gate insulating film can be prevented from being damaged.

However, higher integration of the semiconductor device has been making the gate insulating film thinner year by year, and consequently the breakdown voltage of the gate insulating film has become smaller than the junction breakdown voltage of the protection diode. Therefore, as the gate insulating film becomes thinner, the charging current leaking to the gate electrode without flowing into the protection diode is increasing.

The effect of suppressing the plasma charging damage by the protection diode becomes smaller as the gate insulating film becomes thinner, and although the protection diode is provided, the device characteristics are deteriorated by the plasma charging damage.

Furthermore, when the semiconductor substrate on which the protection diode is formed is subjected to the plasma process, a problem as described below may be caused. This problem will be described while describing a method for manufacturing a conventional semiconductor device with reference to FIG. 13.

FIG. 13 is a cross-sectional view showing a process for forming an interlayer insulating film in a conventional semiconductor devise. FIG. 13A is a cross-sectional view taken along the normal direction of a semiconductor substrate, and FIG. 13B is a cross-sectional view taken along a line F-F' shown in FIG. 13A. The semiconductor device shown in FIG. 13 has a multilayered conductor structure.

First, a gate insulating film 136 is formed on a p-type silicon substrate 131 provided with a plurality of element separations 132 and an n-well 133. As a method for forming the element separation 132, the STI (shallow trench isolation) method can be used. Then, a gate electrode 137 is formed on the gate insulating film (film thickness: 2.2 nm) 136, and a side wall 138 is formed on the opposite side faces of the gate insulating film 136 and the gate electrode 137. The gate electrode 137 is formed of p+ polysilicon.

Then, an active region (p+) 135 that is to serve as the protection diode, a source (p+) region 134a and a drain (p+) region 134b are formed by ion implantation. Thus, a p-channel MOS transistor provided with the gate insulating film 136 and the gate electrode 137 is completed. Thereafter, a plasma is generated with a plasma CVD apparatus (not shown) to form a first interlayer insulating film 140.

Furthermore, a contact hole is formed in the first interlayer insulating film 140 and filled with tungsten, so that W plugs 139a to 139c are formed. Thereafter, conductors 142a, 142b, 143 and 144 are formed simultaneously by the damascene method. These conductors are copper conductors (thickness: 500 nm) and embedded in the first interlayer insulating film 140.

The conductor 142a is formed so as to be connected to the gate electrode 137 via the W plug 139c and be connected to the active region 135 via the W plug 139b. The conductor 142b is formed so as to be connected to the active region 135 via the W plug 139a.

On the other hand, as seen from FIG. 13B, the conductors 143 and 144 are dummy conductors for ensuring smoothness in the CMP (chemical mechanical polishing) process that is performed in the damascene method. The conductors 143 and 144 are insulated by a first insulating layer 140 and a second insulating layer 141 and are electrically suspended.

Then, a plasma is generated with a plasma CVD apparatus (not shown) to form a second interlayer insulating film 141 on the first interlayer insulating film 140. Thereafter, in the same manner as in the process as described above, W plugs 148a and 148b are formed in the second interlayer insulating film 141, and further, conductors 145a, 145b and 146 are formed. The conductor 146 is a dummy conductor as the conductors 143 and 144 and positioned immediately above the conductors 143 and 144.

Thereafter as shown in FIG. 13, a plasma is generated with a plasma CVD apparatus (not shown) to form a third interlayer insulating film 147 on the second interlayer insulating film 141. Thus, a semiconductor device having a desired multilayered conductor structure can be obtained by repeating formation of interlayer insulating films, formation of W plugs, and formation of conductors.

As described above, the first interlayer insulating film 140, the second interlayer insulating film 141 and the third interlayer insulating film 147 are formed by a plasma process with a plasma CVD apparatus (not shown), and rays in the ultraviolet region are radiated from the plasma toward the silicon substrate 131 during the plasma process. When such rays in the ultraviolet region are incident on the active region 135, a phenomenon occurs in which the rectification property of the diode is lost, depending on the amount of the incident rays, and leakage current in the forward direction between the active region 135 and the n-well 133 increases.

When such a phenomenon occurs, even if an electric field is applied in the reverse direction (the direction from the silicon substrate to plasma), the charging current from the plasma flows off to the ground potential via the protection diode, which reduces an electrical stress to be applied to the gate insulating film 37.

However, in the example of FIG. 13, the conductor 144 is positioned immediately above the active region 135 during formation of the second interlayer insulating film 141, and one conductor 146 is positioned immediately above the active region 135 during formation of the third interlayer insulating film 147. In FIG. 13B, reference numeral 145 denotes a region obtained by projecting the active region 135 on the cross-sectional plane of the first interlayer insulating film 140 along the normal direction of the silicon substrate 131.

For this reason, a part of the rays in the ultraviolet region radiated from the plasma to the protection diode is absorbed by the conductor 144 during the formation of the second interlayer insulating film 141 and absorbed by the conductor 144 and the conductor 146 during the formation of the third interlayer insulating film 148. In this case, the amount of the light incident to the active region 135 is not sufficient, and furthermore it can be said that the generated leak current in the forward direction is small.

Therefore, when an electric field is applied in the reverse direction, a part of the charging current from the plasma does not flow through the protection diode, and is directed to the gate insulating film 136, which applies electrical stress to the gate insulating film 136, and thus the device characteristics are damaged. Furthermore, in the plasma process, the voltage waveform in a plasma CVD apparatus may be switched, and it can be said that not infrequently, the electric field may be applied to the silicon substrate 131, not in the forward direction, but in the reverse direction Thus, in the example of FIG. 13, although the protection diode is formed, when an electric field is applied in the reverse direction both during the formation of the second interlayer insulating film 141 and during the formation of the third interlayer insulating film 147, electrical stress is applied to the gate insulating film 136 twice. Therefore, it is pointed out that there is a limitation regarding the role of the protection diode.

DISCLOSURE OF INVENTION

It is a first object of the present invention to solve the above-described problem and provide a semiconductor device that can suppress plasma charging damage in a plasma process and a method for manufacturing the same.

In order to achieve the first object, a first semiconductor device of the present invention includes a semiconductor substrate, a gate insulating film provided on the semiconductor substrate, a gate electrode provided on the gate insulating film, an insulating layer covering the gate insulating film and the gate electrode, and a conductor provided in the insulating layer. The conductor has a conductor for a gate electrode connected electrically to the gate electrode and a dummy conductor, and the dummy conductor is connected electrically to an active region formed in the semiconductor substrate.

According to the first semiconductor device of the present invention, the dummy conductor is connected electrically to an active region formed in the silicon substrate. Therefore, the charging current caused by plasma flows into, not the conductor for a gate electrode, but the dummy conductor. Furthermore, the active region to which the dummy conductor is connected does not constitute a protection diode as disclosed in JP10-173157A. Therefore, according to the semiconductor device of the present invention, even if the thickness of the gate insulating film is reduced even more, the charging current is suppressed from flowing into the conductor for a gate electrode.

Next, a first method for manufacturing a semiconductor device of present invention to achieve the first object includes the steps of: (a) forming at least a laminate of a gate insulating film and a gate electrode, and an active region on a semiconductor substrate; (b) forming a first insulating layer that covers the laminate and the active region on the semiconductor substrate; (c) forming simultaneously a conductor for a gate electrode that is connected electrically to the gate electrode and a dummy electrode connected electrically to the active region on the first insulating layer; and (d) forming a second insulating layer on the first insulating layer by a plasma process.

According to the first method for manufacturing a semiconductor device of the present invention, the second insulating layer is formed in the state where the dummy conductor is connected electrically to an active region formed in the silicon substrate. Therefore, the charging current caused by plasma during formation of the second insulating layer flows into, not the conductor for a gate electrode, but the dummy conductor. Furthermore, the active region to which the dummy conductor is connected does not constitute a protection diode as disclosed in JP10-173157A. Therefore, according to the method for manufacturing a semiconductor device of the present invention, even if the thickness of the gate insulating film is reduced even more, the charging current is suppressed from flowing into the conductor for a gate electrode.

It is a second object of the present invention to solve the above-described problem and provide a semiconductor device that can suppress plasma charging damage without being influenced by the application direction of an electric field at the time of a plasma process and a method for manufacturing the same.

In order to achieve the second object, a second semiconductor device of the present invention includes a semiconductor substrate, a gate insulating film provided on the semiconductor substrate, a gate electrode provided on the gate insulating film, an insulating layer covering the gate insulating film and the gate electrode, and a conductor provided in the insulating layer. An active region that serves as a diode is formed on the semiconductor substrate. The conductor has at least a dummy conductor, and a non-dummy conductor connected electrically to the gate electrode or the active region. The dummy conductor is provided so as not to be overlapped with a region obtained by projecting the active region on the insulating layer along the normal direction of the semiconductor substrate.

When the second semiconductor device is used, compared with the example of FIG. 13 shown in "Background Art", more rays in the ultraviolet region are incident on the active region serving as a diode, so that the rectification property of the diode is reduced significantly and the leakage current in the forward direction in the active region is increased. Therefore, even if the electric field by plasma is applied in the reverse direction, the charging current from the plasma can flow off to the ground potential via the diode, and electrical stress applied to the gate insulating film during a plasma process can be reduced.

Furthermore, in order to achieve the second object, a third semiconductor device of the present invention includes a semiconductor substrate, a gate insulating film provided on the semiconductor substrate, a gate electrode provided on the gate insulating film, and a plurality of insulating layers. An active region that serves as a diode is formed on the semiconductor substrate. A lowermost insulating layer of the plurality of insulating layers is formed so as to cover the gate insulating film and the gate electrode, and a first dummy conductor and a first conductor connected electrically to the gate electrode or the active region are provided in the lowermost insulating layer. A second dummy conductor and a second conductor connected electrically to the first conductor are provided in an insulating layer positioned above the lowermost insulating layer. The second dummy conductor is provided so as not to be overlapped with a region obtained by projecting the active region on the insulating layer in which the second dummy conductor is provided along the normal direction of the semiconductor substrate.

Also when the third semiconductor device is used, as in the second semiconductor device, compared with the example of FIG. 13 shown in "Background Art", more rays in the ultraviolet region are incident to the active region serving as a diode, so that the rectification property of the diode is significantly lost and the leak current in the forward direction in the active region is increased. Therefore, electrical stress applied to the gate insulating film during a plasma process can be reduced also in the third semiconductor device.

Furthermore, in order to achieve the second object, a second method for manufacturing a semiconductor device of the present invention includes the steps of: (a) forming at least a laminate of a gate insulating film and a gate electrode, and an active region that serves as a diode on a semiconductor substrate; (b) forming a first insulating layer that covers the laminate and the active region on the semiconductor substrate by a plasma process; (c) forming simultaneously a dummy conductor, and a non-dummy conductor connected electrically to the gate electrode or the active region on the first insulating layer; and (d) forming a second insulating layer on the first insulating layer by a plasma process. In the step (c), the dummy conductor and the non-dummy conductor are provided so that the dummy conductor is not overlapped with a region obtained by projecting the active region on the insulating layer along the normal direction of the semiconductor substrate.

When the second method for manufacturing a semiconductor device is used, compared with the example of FIG. 13 shown in "Background Art", more rays in the ultraviolet region are incident on the active region serving as a diode when forming the second insulating layer by a plasma process. Therefore, the rectification property of the diode is reduced significantly and the leakage current in the forward direction in the active region is increased. Therefore, even if the electric field by plasma is applied in the reverse direction, the charging current from the plasma can flow off to the ground potential via the diode, and a semiconductor device can be produced while electrical stress applied to the gate insulating film during a plasma process is reduced.

Furthermore, in order to achieve the second object, a third method for manufacturing a semiconductor device of the present invention includes the steps of: (a) forming at least a laminate of a gate insulating film and a gate electrode, and an active region that serves as a diode on a semiconductor substrate; (b) forming an underlying insulating layer that covers the laminate and the active region on the semiconductor substrate by a plasma process; (c) forming simultaneously a first dummy conductor, and a first conductor connected electrically to the gate electrode or the active region on the underlying insulating layer; (d) forming an insulating layer positioned above the underlying insulating layer by a plasma process; and (e) forming simultaneously a second dummy conductor, and a second conductor connected electrically to the first conductor on the insulating layer obtained in the step (d). In the step (e), the second dummy conductor and the second conductor are provided so that the second dummy conductor is not overlapped with a region obtained by projecting the active region on the insulating layer in which the second dummy conductor is formed along the normal direction of the semiconductor substrate.

When the third method for manufacturing a semiconductor device is used, compared with the example of FIG. 13 shown in "Background Art", more rays in the ultraviolet region are incident on the active region serving as a diode when forming another insulating layer on the insulating layer obtained in the step (c) by a plasma process. Therefore, also in the third method for manufacturing a semiconductor device, the rectification property of the diode is reduced significantly and the leakage current in the forward direction in the active region is increased, and a semiconductor device can be produced while electrical stress applied to the gate insulating film during a plasma process is reduced.

BRIEF DESCRIPTION OF DRAWINGS

FIG. 1 is a cross-sectional view partially showing the configuration of a semiconductor device of Embodiment 1 of the present invention.

FIG. 3 is a cross-sectional view partially showing the configuration of a semiconductor device of Embodiment 2 of the present invention.

FIG. 6 is a cross-sectional view partially showing the configuration of a semiconductor device of Embodiment 3 of the present invention.

FIG. 10 is a cross-sectional view partially showing the configuration of a semiconductor device of Embodiment 4 of the present invention.

FIG. 11 is a cross-sectional view partially showing the configuration of a conventional semiconductor device.

FIG. 13 is a cross-sectional view showing a process for forming an interlayer insulating film in a conventional semiconductor devise.

BEST MODE FOR CARRYING OUT THE INVENTION

Figure 1A:
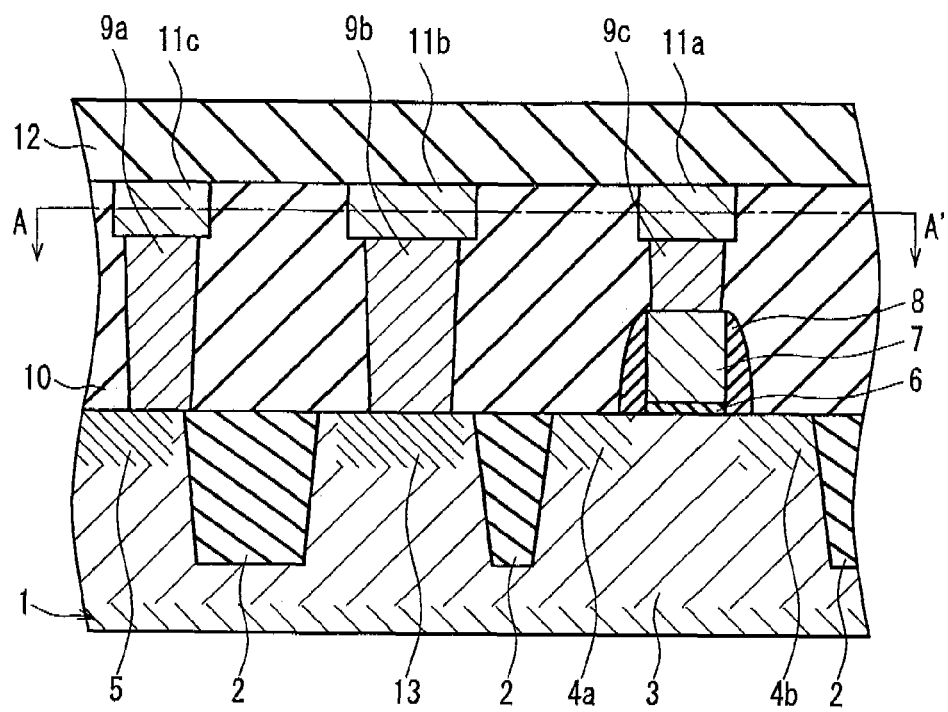
FIG. 1A is a cross-sectional view taken along the normal direction of a semiconductor substrate constituting the semiconductor device.

In the first semiconductor device of the present invention, it is preferable that the active region to which the dummy conductor is connected is an active region that does not serve as either a source region or a drain region. In this case, it is preferable that an active region that serves as a source region or a drain region is formed on the semiconductor substrate, and the conductor further has a conductor connected electrically to the active region that serves as a source region or a drain region.

Furthermore, in the first semiconductor device of the present invention, it is preferable that a second dummy conductor is formed in a position adjacent to the dummy conductor and is insulated by the insulating layer at its entire circumference. In this case, it is preferable that the dummy conductor is positioned adjacent to the conductor for a gate electrode, and the second dummy conductor is constituted by a plurality of conductors, and the plurality of conductors constituting the second dummy conductor are arranged so as to surround the dummy conductor on the side that is not adjacent to the conductor for a gate electrode of the dummy conductor.

Furthermore, in the first semiconductor device of the present invention, it is preferable that the conductor is formed by a damascene method and embedded in the insulating layer, and the active region to which the dummy conductor is connected is provided, spaced by an element separation, in a position adjacent to a region of the semiconductor substrate in which the gate insulating film is provided.

It is preferable that the conductor for a gate electrode, the dummy conductor and the second dummy conductor are formed of the same metal material, and the metal material can be a metal material containing copper.

In the first method for manufacturing a semiconductor device of the present invention, it is preferable that in the step (d), the second insulating layer is formed while charging current generated from plasma by the plasma process is emitted through the dummy conductor. It also is preferable that in the step (c), the conductor for a gate electrode and the dummy conductor are formed by a damascene method.

In the first method for manufacturing a semiconductor device of the present invention, it is preferable that in the step (a), an active region that serves as a source region or a drain region and an active region that does not serve as either a source region or a drain region are formed, and in the step (c), the dummy conductor is connected to the active region that does not serve as either a source region or a drain region. Furthermore, it is preferable that the first insulating layer is an underlying interlayer insulating film for forming multilayer wiring, and the second insulating layer is an interlayer insulating film for forming multilayer wiring.

In the first method for manufacturing a semiconductor device of the present invention, it is preferable that in the step (c), the second dummy conductor insulated from the gate electrode and the active region by the first insulating layer is formed in a position adjacent to the dummy conductor simultaneously with the conductor for a gate electrode. Furthermore, it is preferable that the first insulating layer and the second insulating layer are silicon oxide films or silicon nitride films.

In the second semiconductor device, it is preferable that the dummy conductor and the non-dummy conductor are formed simultaneously by a damascene method and embedded in the insulating layer. In this embodiment, it is preferable that the dummy conductor and the non-dummy conductor are formed of the same metal material, and in particular, it is preferable that the metal material is a metal material containing copper.

In the third semiconductor device of the present invention, it is preferable that the first dummy conductor and the first conductor are formed simultaneously by a damascene method and embedded in the lowermost insulating layer, and the second conductor and the second dummy conductor that are provided in the same insulating layer are formed simultaneously by a damascene method and embedded in the insulating layer in which these conductors are provided. In this embodiment, it is preferable that the first dummy conductor, the first conductor, the second dummy conductor and the second conductor are formed of the same metal material, and in particular, it is preferable that the metal material is a metal material containing copper.

In the second method for manufacturing a semiconductor device, it is preferable that in the step (c), the dummy conductor and the non-dummy conductor are formed by a damascene method. Furthermore, it is preferable that the first insulating layer and the second insulating layer are silicon oxide films or silicon nitride films.

In the third method for manufacturing a semiconductor device, it is preferable that in the step (c), the first dummy conductor and the first conductor are formed by a damascene method, and in the step (e), the second dummy conductor and the second conductor are formed by a damascene method. Furthermore, it is preferable that the underlying insulating layer and the insulating layer positioned above the underlying insulating layer are silicon oxide films or silicon nitride films.

EMBODIMENT 1

Hereinafter, a semiconductor device and a method for manufacturing the semiconductor device of Embodiment 1 of the present invention will be described with reference to FIGS. 1 and 2. First, the configuration of the semiconductor device of Embodiment 1 will be described with reference to FIG. 1.

Figure 11A:
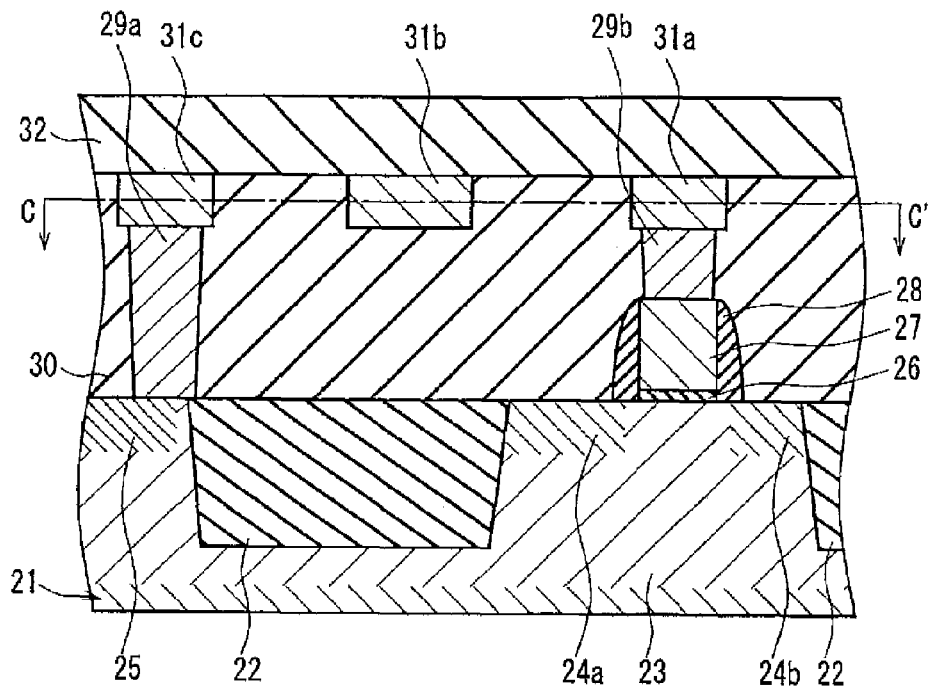
FIG. 11A is a cross-sectional view taken along the normal direction of a semiconductor substrate constituting the semiconductor device.
Figure 11B:
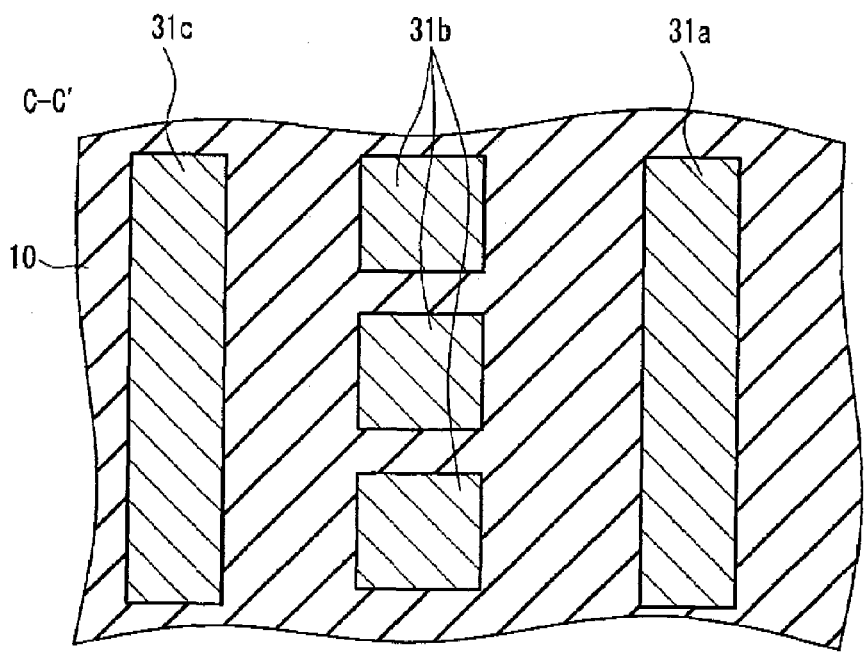
FIG. 11B is a cross-sectional view taken along a line C-C' shown in FIG. 11A.

As shown in FIG. 1A, the semiconductor device of Embodiment 1 includes an n-type silicon substrate 1 as in the semiconductor device shown in FIG. 11 described in "Background Art", and a plurality of element separations 2 are formed on the silicon substrate 1 at a predetermined interval so as to be exposed on the silicon substrate 1.

Between the element separations 2 on the silicon substrate 1, an n-channel MOS transistor is formed with a p-well 3 formed in the internal portion of the n-type silicon substrate 1, a gate insulating film 6 and a gate electrode 7 formed of n+ polysilicon, and a source (n+) region 4a and a drain (n+) region 4b that are provided in the surface portion of the silicon substrate 1, as in the semiconductor device shown in FIG. 11 described in "Background Art".

The gate insulating film 6 and the gate electrode 7 are formed so as to be aligned with each other as in the semiconductor device shown in FIG. 11 described in "Background Art". In the opposite side faces thereof, a side wall (side face protective film) 8 is formed so as to cover the opposite side faces. Reference numeral 5 is an n+ region and is an active region that serves as a source region or a drain region of another transistor.

Furthermore, an underlying interlayer insulating film 10 and an interlayer insulating film 12 are laminated sequentially on the silicon substrate 1 to realize multilayer wiring as in the semiconductor device shown in FIG. 11 described in "Background Art". Conductors 11a to 11c are formed in the underlying interlayer insulating film 10. The underlying interlayer insulating film 10 and an interlayer insulating film 12 are silicon oxide films or silicon nitride films.

Figure 1B:
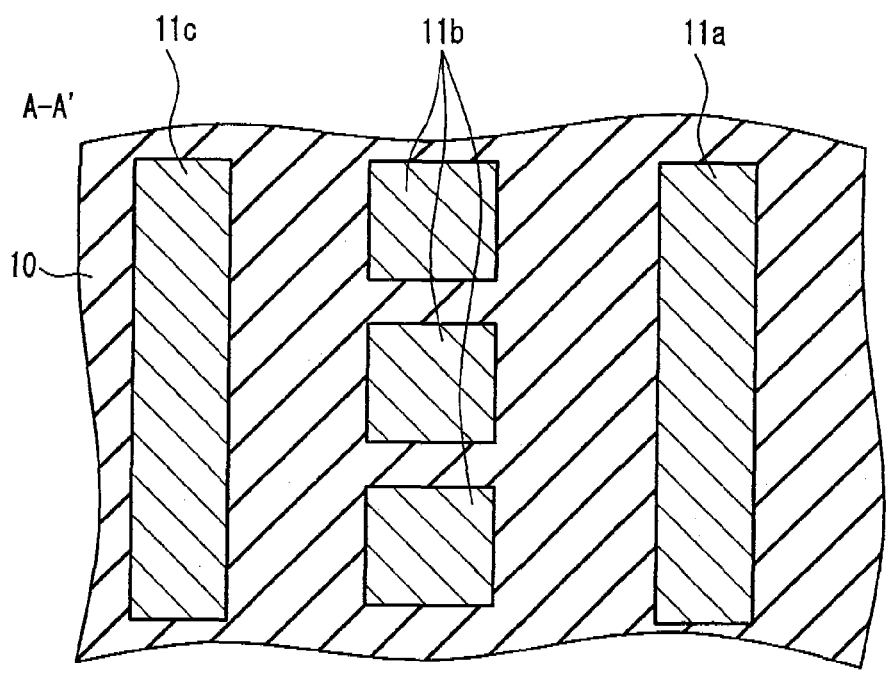
FIG. 1B is a cross-sectional view taken along a line A-A' shown in FIG. 1A.

The conductors 11a to 11c are copper conductors (thickness: 500 nm) simultaneously formed by the damascene method and embedded in the underlying interlayer insulating film 10. The conductor 11a is a conductor for gate electrode connection that is connected to the gate electrode 7 via a W (tungsten) plug 9c. The conductor 11c is a conductor for source and drain connection that is connected to the n+ region 5 via a W (tungsten) plug 9a. Also in this embodiment, the conductors 11a and 11c are formed in a strip shape, as shown in FIG. 1B.

The conductor 11b is a dummy conductor for ensuring smoothness in the CMP process performed in the damascene method, and does not contribute to the function of the semiconductor device. As shown in FIG. 1B, for the conductors 11b, a plurality of conductors are provided and each is formed in a square shape.

Thus, the semiconductor device of Embodiment 1 has the same configuration as the conventional semiconductor device shown in FIG. 11 described in "Background Art", but has different aspects from the conventional semiconductor device as described below.

In Embodiment 1, unlike in the semiconductor device shown in FIG. 11 described in "Background Art", an active region (n+ region) 13 that does not serve as either a source region or a drain region is provided, spaced by the element separation 2, in a position adjacent to a region of the silicon substrate 1 in which the gate insulating film 6 is provided. Moreover, the conductor 11b, which is a dummy conductor, is not electrically suspended, but connected to this active region 13 via the W plug 9b.

In this specification, "an active region (n+ region) 13 that does not serve as either a source region or a drain region" refers to a region that is formed in the same manner as a source region and a drain region, but does not serve as either a source region or a drain region because there is no gate electrode adjacent thereto.

Also in Embodiment 1, the W plugs 9a to 9c are formed by filling contact holes formed in the underlying interlayer insulating film 10 with tungsten, as the W plugs 29a and 29b shown in FIG. 11 described in "Background Art". Furthermore, in Embodiment 1, conductors and plugs (not shown) for multilayered wiring are formed in the interlayer insulating film 12, and a plurality of other interlayer insulating films can be formed on the interlayer insulating film 12.

Next, a method for manufacturing the semiconductor device of Embodiment 1 and a function of dummy conductors will be described with reference to FIG. 2. FIG. 2 shows a process for forming an interlayer insulating film constituting the semiconductor device shown in FIG. 1. FIG. 2 shows schematically the manner in which the occurrence of plasma charging damage is suppressed with Embodiment 1.

First, the gate insulating film 6 is formed on the silicon substrate 1 provided with the element separations 2 and the p-well 3. Then, the gate electrode 7 is formed on the gate insulating film 6, and the side wall 8 is formed on the opposite side face of the gate insulating film 6 and the gate electrode 7.

Then, the n+ region 5, the source (n+) region 4a and the drain (n+) region 4b, and further the active region 13 are formed by ion implantation of, for example, As or P. Thereafter, a plasma is generated with a plasma CVD apparatus (not shown) to form the underlying interlayer insulating film 10. At this time, the conductor 11a to be connected to the gate electrode 7 has not been formed yet, so that no charge current is generated by the plasma.

Then, in the underlying interlayer insulating film 10, a contact hole that exposes the n+ region 5 at the bottom face, a contact hole that exposes the active region 13 at the bottom face, and a contact hole that exposes the gate electrode 7 at the bottom face are formed. Furthermore, these contact holes are filled with tungsten to form the W plugs 9a to 9c.

Thereafter, the conductors 11a to 11c are formed simultaneously by the damascene method. More specifically, trenches to expose the W plugs 9a to 9c at the bottom face are formed in the underlying interlayer insulating film 10, and copper layers are formed so as to fill these trenches, and then excess thickness is removed by polishing by the CMP method.

Figure 2:
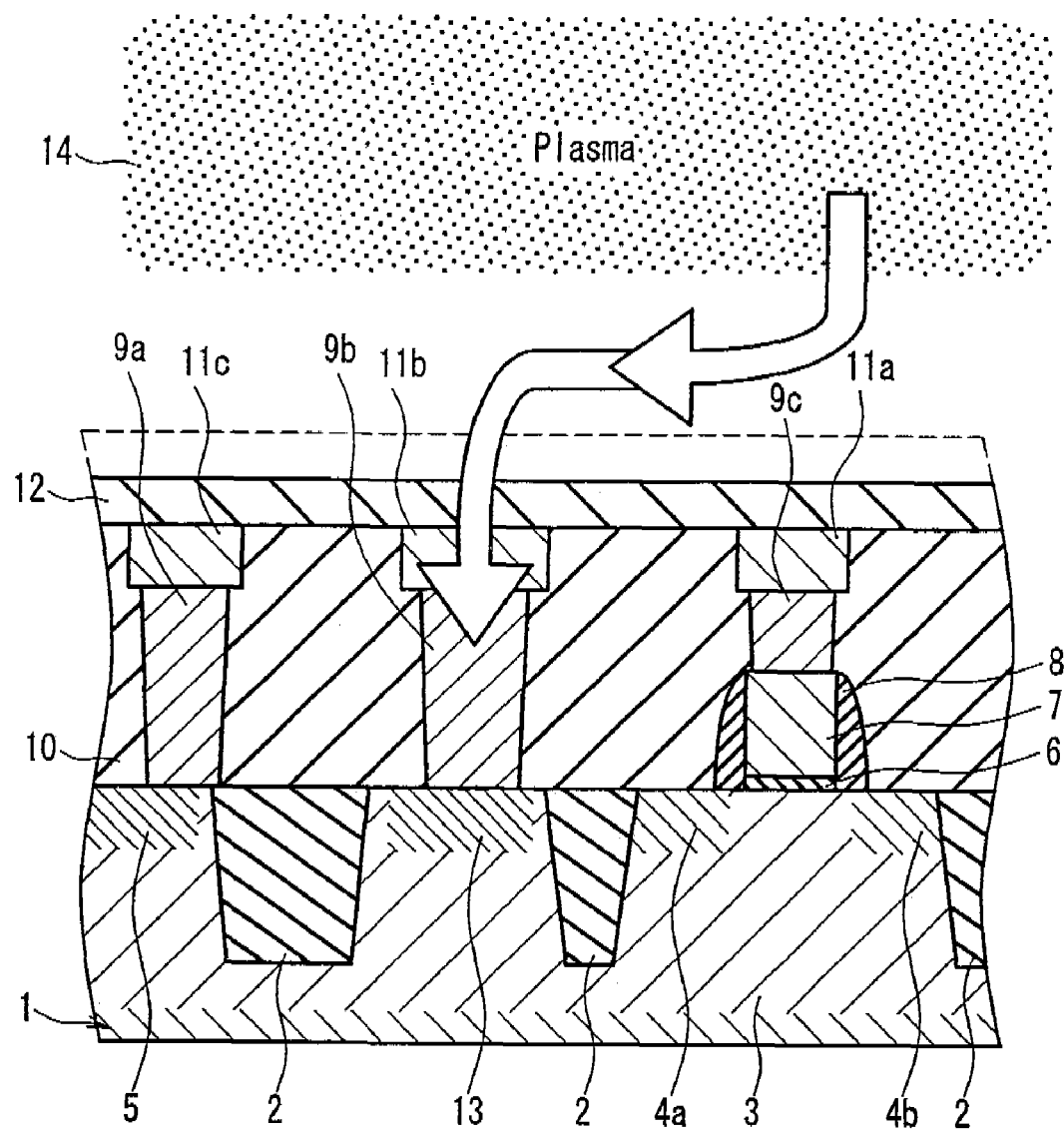
FIG. 2 is a cross-sectional view showing a method for manufacturing the semiconductor device of Embodiment 1 of the present invention.
Figure 12:
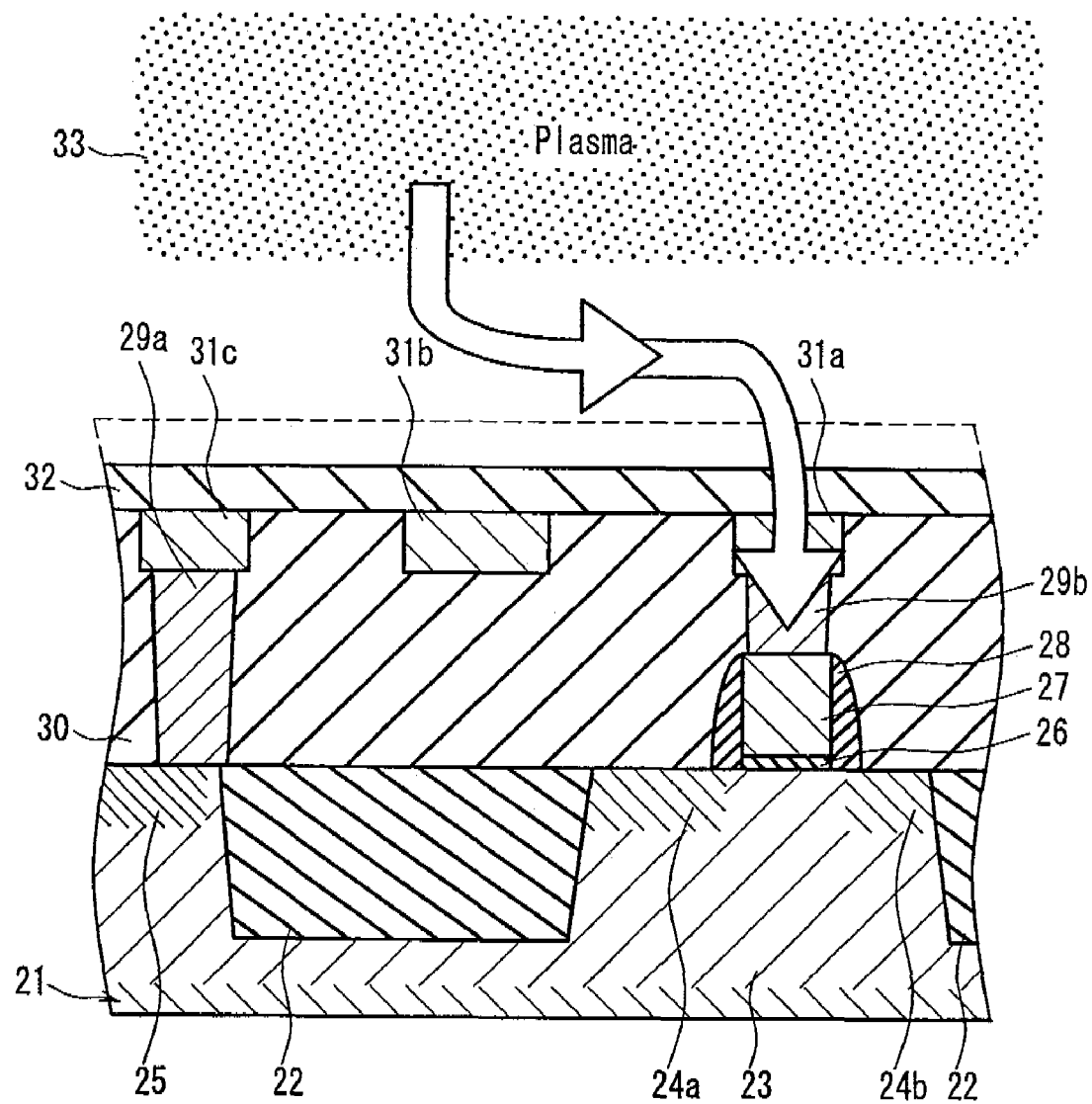
FIG. 12 is a cross-sectional view showing a process for forming an interlayer insulating film in the conventional semiconductor device shown in FIG. 11, showing schematically occurrence of plasma charging damage.

Next, as shown in FIG. 2, a plasma 14 is generated with a plasma CVD apparatus (not shown) to form the interlayer insulating film 12. At this time, in Embodiment 1, unlike the case of FIG. 12 described in "Background Art", the conductor 11b, which is a dummy conductor, is connected electrically to the active region 13 formed in the silicon substrate 1 via the W plug 9b. Therefore, the charging current during the film formation with the plasma 14 flows through, not the conductor 11a connected to the gate electrode 7, but the conductor 11b.

Furthermore, in Embodiment 1, the dummy conductor (conductor 11b) is not connected a protection diode as disclosed in JP10-173157A described in "Background Art", but is connected electrically to the active region 13. Moreover, the dummy conductor (conductor 11b) is insulated from the conductor for gate electrode connection (conductor 11a). Therefore, even if the thickness of the gate insulating film is further reduced, the charging current will flow into the conductor 11b, which is a dummy conductor.

Thus, according to Embodiment 1, even if the breakdown voltage of the gate insulating film is reduced because of a decrease of the film thickness, the deterioration of the device characteristics due to breakdown of the gate insulating film 6 can be suppressed.

In Embodiment 1, all of the formed dummy conductors do not have to be connected to the active region 13, and it is sufficient that a part of the dummy conductors are connected to the active region 13. In Embodiment 1, the ratio of the connection of the formed dummy conductors to the active region 13 can be set as appropriate, depending on the process conditions such as the thickness of the gate insulating film 6.

EMBODIMENT 2

Figure 3A:
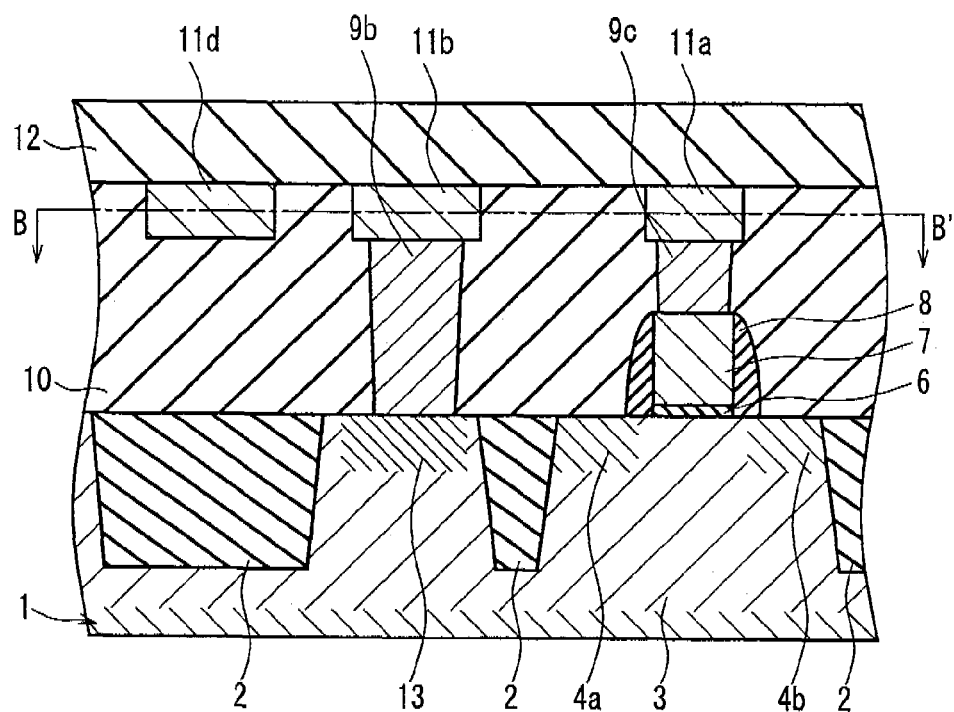
FIG. 3A is a cross-sectional view taken along the normal direction of a semiconductor substrate constituting the semiconductor device.

Next, a semiconductor device and a method for manufacturing the semiconductor device of Embodiment 2 of the present invention will be described with reference to FIGS. 3 and 4. First, the configuration of the semiconductor device of Embodiment 2 will be described with reference to FIG. 3. In FIGS. 3 and 4, the portion denoted by the same reference numeral as in FIG. 1 is the same portion as in FIG. 1.

As shown in FIG. 3, in Embodiment 2, unlike in Embodiment 1, a conductor 11d that is a second dummy conductor is provided. The conductor 11d also is formed simultaneously with the conductors 11a and 11b by the damascene method, but the entire circumference of the conductor 11d is insulated by the underlying interlayer insulating film 10 and the interlayer insulating film 12, and the conductor 11d is electrically suspended.

Next, a method for manufacturing the semiconductor device of Embodiment 2 and a function of dummy conductors will be described with reference to FIG. 4. FIG. 4 is a cross-sectional view showing a method for manufacturing the semiconductor device of Embodiment 2 of the present invention. FIG. 4 shows a process for forming an interlayer insulating film constituting the semiconductor device shown in FIG. 2. FIG. 4 shows schematically the manner in which occurrence of plasma charging damage is suppressed with Embodiment 2.

First, as in Embodiment 1, the gate insulating film 6 is formed on the silicon substrate 1 provided with the element separations 2 and the p-well 3. Then, the gate electrode 7 and the side wall 8 are formed.

Then, the source (n+) region 4a and the drain (n+) region 4b, and further the active region 13 are formed by ion implantation, as in Embodiment 1. Thereafter, a plasma is generated with a plasma CVD apparatus (not shown) to form the underlying interlayer insulating film 10. Thereafter, as in Embodiment 1, the W plugs 9b and 9c are formed in the underlying interlayer insulating film 10, and then the conductors 11a, 11b and 11d are formed simultaneously by the damascene method.

Next, as shown in FIG. 4, a plasma 14 is generated with a plasma CVD apparatus (not shown) to form the interlayer insulating film 12. At this time, in Embodiment 2 as well as in the case of FIG. 2 shown in Embodiment 1, the charging current during the film formation with the plasma 14 flows through, not the conductor 11a connected to the gate electrode 7, but the conductor 11b.

However, in Embodiment 2, unlike Embodiment 1, the conductor 11d is provided adjacent to the conductor connected to the active region 13. Therefore, the conductor 11b is able to collect charges more easily than in the case shown in Embodiment 1.

In other words, in Embodiment 2, the charging current from the plasma 14 is allowed to flow selectively through the conductor 11b by providing the conductor 11d that is electrically suspended adjacent to the conductor 11b. Consequently, more charging current flows through the conductor 11b than in the case shown in Embodiment 1. Therefore, according to Embodiment 2, the effect of suppressing the deterioration of the device characteristics can be increased further.

Figure 3B:
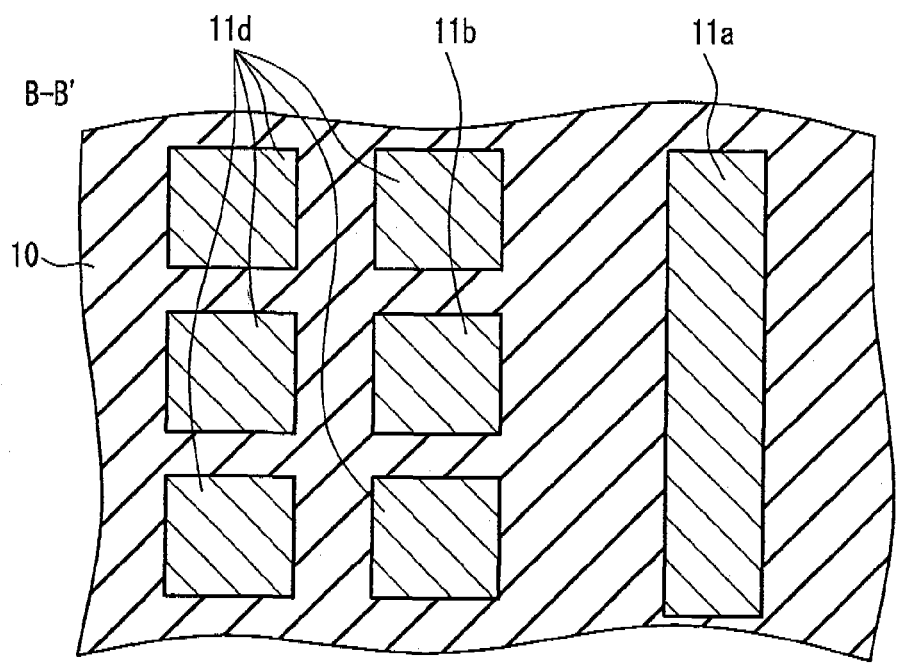
FIG. 3B is a cross-sectional view taken along a line B-B' shown in FIG. 3A.
Figure 4:
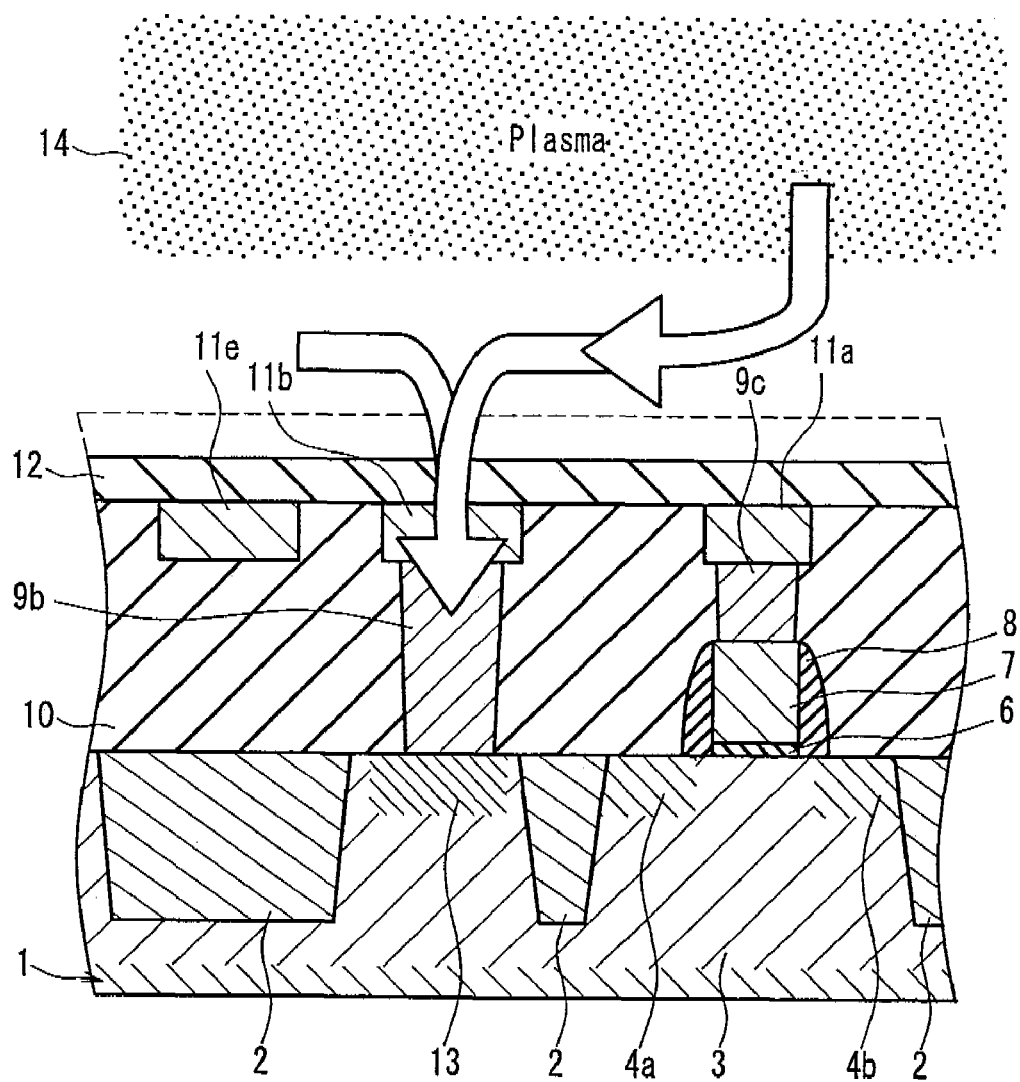
FIG. 4 is a cross-sectional view showing a method for manufacturing the semiconductor device of Embodiment 2 of the present invention.

In Embodiment 2, as shown in FIG. 3B, for the conductor 11d, which is the second dummy conductor, a plurality of conductors are provided. Furthermore, the plurality of conductors 11d are formed adjacent to the conductor (dummy conductor) 11b connected to the active region 13 and formed so as to surround the conductor 11b on the side that is not adjacent to the conductor 11a (conductor for a gate electrode) of the conductor 11b. Consequently, concentration of the charging current to the conductor 11b can be performed efficiently.

In Embodiment 2, the layout of the conductors 11d, which are the second dummy conductors, is not limited to the layout shown in FIG. 3B. The layout of the conductors 11d can be set as appropriate, depending on the process characteristics in the CMP process or a design rule of the dummy conductors or the like.

Figure 5:
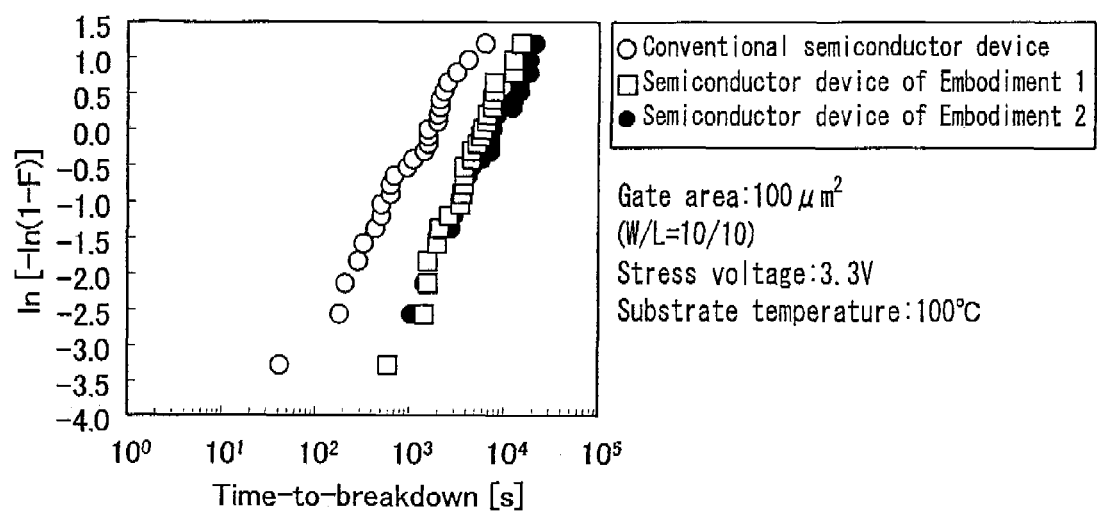
FIG. 5 is a graph showing the lifetime of the semiconductor devices of Embodiments 1 and 2.

Hereinafter, the effect of the semiconductor device and the method for manufacturing the semiconductor device of Embodiments 1 and 2 as described above will be described with reference to FIG. 5. FIG. 5 is a graph showing the lifetime of the semiconductor devices of Embodiments 1 and 2.

In FIG. 5, the horizontal axis shows the lifetime of the semiconductor device at the time of the constant voltage TDDB (time dependent dielectric breakdown) test, which serves as an indicator of the reliability lifetime, and the vertical axis shows the cumulative defective ratio based on the Weibull distribution, "Conventional semiconductor device" in FIG. 5 shows the semiconductor device shown in FIG. 11. The thickness of the gate insulating film is 2.2 nm in all of the conventional semiconductor device and the semiconductor devices of Embodiments 1 and 2.

As seen from FIG. 5, when the cumulative defective ratio is the same, the time by the breakdown of the conventional semiconductor device (○ in FIG. 5) is always shorter in any case than that of the semiconductor device of Embodiment 1 of the present invention (□ in FIG. 5) and the semiconductor device of Embodiment 2 of the present invention (● in FIG. 5). This indicates that the semiconductor device of Embodiment 1 of the present invention (□ in FIG. 5) and the semiconductor device of Embodiment 2 of the present invention (● in FIG. 5) have longer lifetimes than that of the conventional semiconductor device (○ in FIG. 5). In other words, according to the semiconductor device and the method for manufacturing a semiconductor device of the present invention, the deterioration of the device characteristics can be suppressed.

Embodiments 1 and 2 are not limited to the examples shown in FIGS. 1 to 5. In Embodiments 1 and 2, it is sufficient that the dummy conductors are connected electrically to the active region that does not serve as either a source region or a drain region. The type of the active region to which the dummy conductor is connected is not limited to the n type, and can be the p type. Furthermore, in Embodiments 1 and 2, the semiconductor substrate may be a p type silicon substrate or a substrate other than a silicon substrate.

In the examples shown in FIGS. 1 to 5, the interlayer insulating film 12 is laminated after the W plugs 9a to 9c and the Cu conductors 11 are formed in the underlying interlayer insulating film 10. However, the present invention is not limited thereto. For example, only W plugs 9a to 9c may be formed in the underlying interlayer insulating film 10, and thereafter the interlayer insulating film 12 can be laminated.

In this embodiment, the dummy conductor 11b is not present, but the W plug 9b serves as the dummy conductor 11b. In other words, in this embodiment, the charging current during the film formation with the plasma 14 (FIGS. 2 and 4) flows through the W plug 9b for an active region adjacent to the W plug 9c for a gate electrode, and thus W plug 9b serves as the dummy conductor 11b. Thus, also in this embodiment, the deterioration of the device characteristics due to the breakdown of the gate insulating film 6 can be suppressed.

EMBODIMENT 3

Next, a semiconductor device and a method for manufacturing the semiconductor device of Embodiment 3 of the present invention will be described with reference to FIGS. 6 to 9. First, the configuration of the semiconductor device of Embodiment 3 will be described with reference to FIG. 6.

Figure 6A:
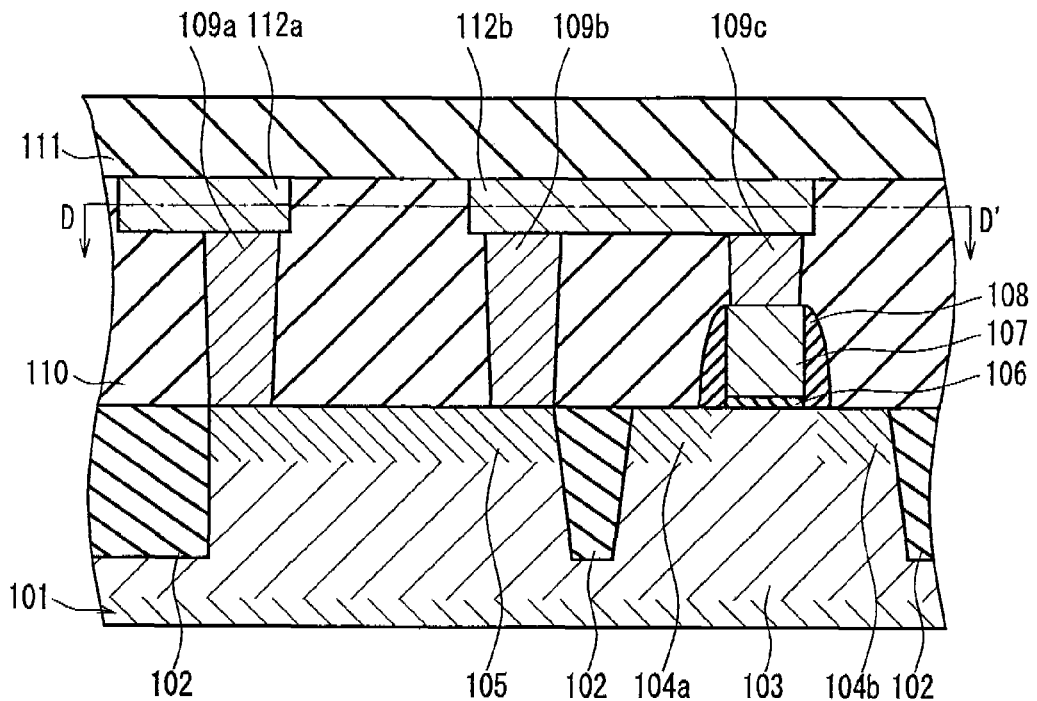
FIG. 6A is a cross-sectional view taken along the normal direction of a semiconductor substrate constituting the semiconductor device.
Figure 13A:
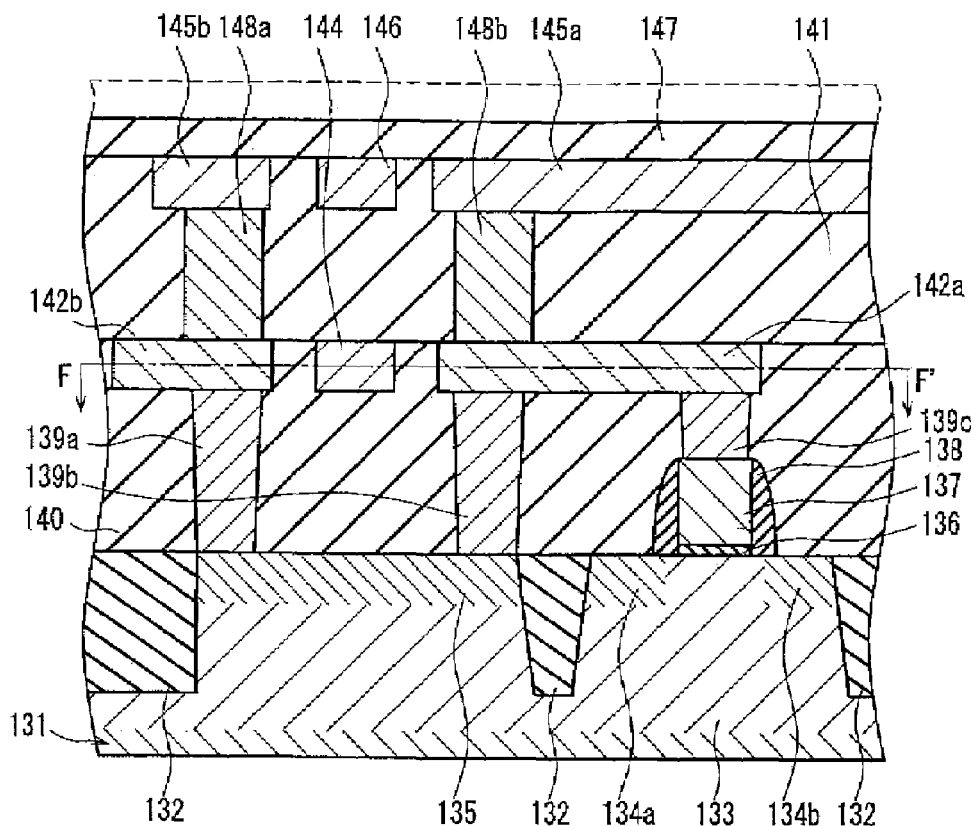
FIG. 13A is a cross-sectional view taken along the normal direction of a semiconductor substrate.
Figure 13B:
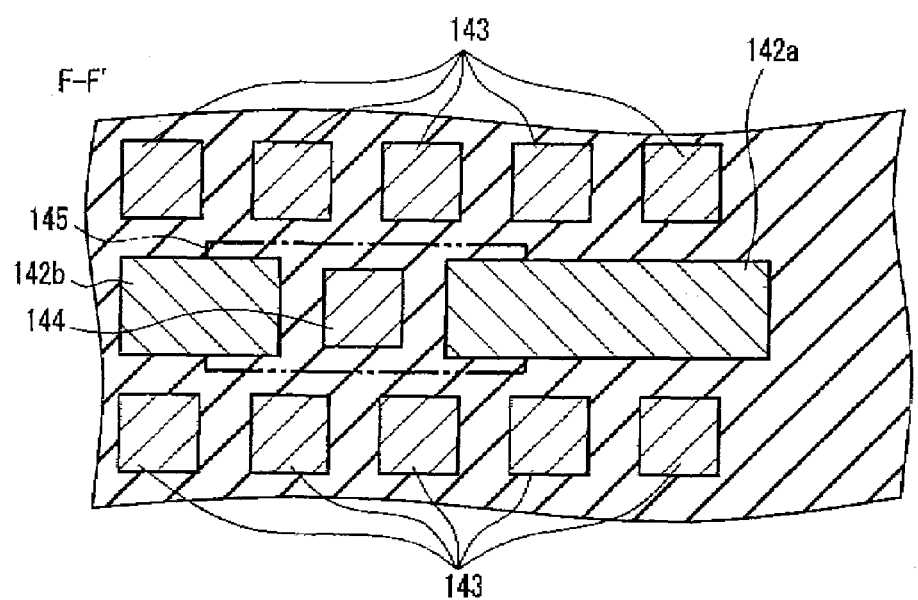
FIG. 13B is a cross-sectional view taken along a line F-F' shown in FIG. 13A.

As shown in FIG. 6A, the semiconductor device of Embodiment 3 includes a p-type silicon substrate 101 as in the semiconductor device shown in FIG. 13 described in "Background Art", and a plurality of element separations 102 are formed on the silicon substrate 101 at a predetermined interval so as to be exposed on the silicon substrate 101.

Between the element separations 102 on the silicon substrate 101, a p-channel MOS transistor is formed with an n-well 103 formed in the internal portion of the silicon substrate 101, a gate insulating film 106 and a gate electrode 107 formed of p+ polysilicon, and a source (p+) region 104a and a drain (p+) region 104b that are provided in the surface portion of the silicon substrate 101, as in the semiconductor device shown in FIG. 13 described in "Background Art".

The gate insulating film 106 and the gate electrode 107 are formed so as to be aligned with each other as in the semiconductor device shown in FIG. 13 described in "Background Art". In the opposite side faces thereof, a side wall (side face protective film) 108 is formed so as to cover the opposite side faces. Furthermore, an active region (p+) 105 that serves as a protection diode is formed in the silicon substrate 101.

Furthermore, a first interlayer insulating film 110 is formed on the silicon substrate 101, and a second interlayer insulating film 111 is formed on the first interlayer insulating film 110, as in the semiconductor device shown in FIG. 13 described in "Background Art". Furthermore, conductors 112a, 112b and 113 are formed in the first interlayer insulating film 110. The first interlayer insulating film 110 and the second interlayer insulating film 111 are silicon oxide films or silicon nitride films.

Figure 6B:
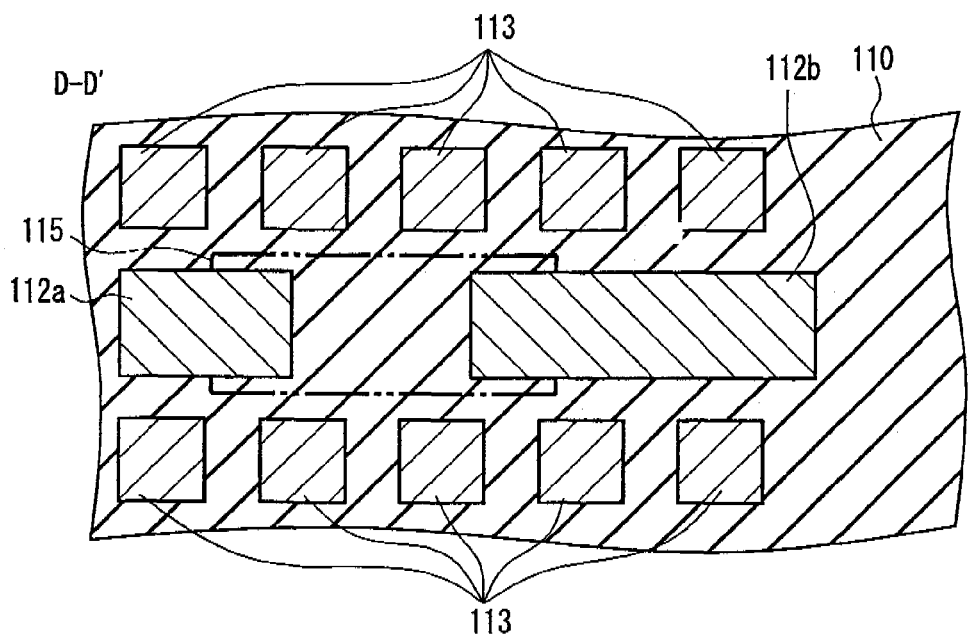
FIG. 6B is a cross-sectional view taken along a line D-D' shown in FIG. 6A.

The conductors 112a, 112b and 113 are copper conductors (thickness: 500 nm) simultaneously formed by the damascene method and embedded in the first interlayer insulating film 110. Among these conductors, the conductor 113 is a dummy conductor for ensuring smoothness in the CMP process performed in the damascene method. The entire circumference of the conductor 113 is insulated by the first interlayer insulating film 110 and the second interlayer insulating film 111 and thus the conductor 113 is electrically suspended. As shown in FIG. 6B, for the conductor 113, a plurality of conductors are provided and each is formed in a square shape.

The conductors 112a and 112b are non-dummy conductors. The conductor 112a is connected to the active region 105 via a W (tungsten) plug 109*a*. The conductor 112*b* is connected to the active region 105 via a W plug 109*b* and is connected to the gate electrode 107 via the W plug 109*c*. In Embodiment 3, as shown in FIG. 6B, the conductors 112*a* and 112*b* are formed in a strip shape.

The W plugs 109*a* to 109*c* are formed by filling contact holes formed in the first interlayer insulating film 110 with tungsten, as the W plugs 139*a* to 139*c* shown in FIG. 13 described in "Background Art".

Thus, the semiconductor device of Embodiment 3 has the same configuration as the conventional semiconductor device shown in FIG. 13 described in "Background Art", but has different aspects from the conventional semiconductor device as described below.

In Embodiment 3, as shown in FIG. 6B, unlike in the semiconductor device shown in FIG. 13 described in "Background Art", the conductor 113, which is a dummy conductor, is provided so as not to be overlapped with a region (projected region) 115 obtained by projecting the active region 105 on the first interlayer insulating film 110 along the normal direction of the silicon substrate 101. In other words, as seen from FIG. 6B, in Embodiment 3, the dummy conductors 113 are not present above the active region 105 serving as a protection diode. Therefore, when forming the second interlayer insulating film 111 by a plasma process, more rays in the ultraviolet region are incident on the active region 105 than that in the example of FIG. 13 shown in "Background Art". This will be described below.

Figure 7:
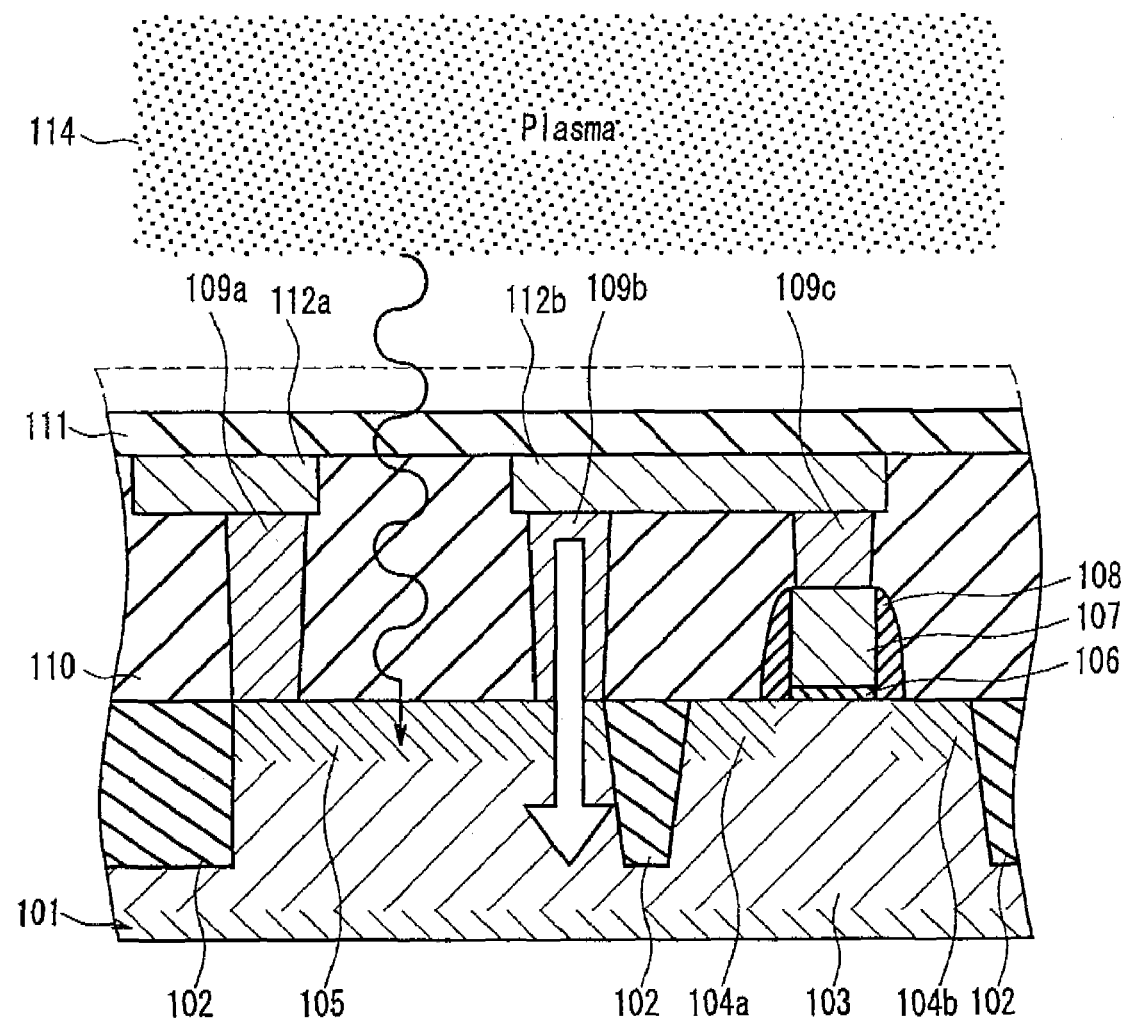
FIG. 7 is a cross-sectional view showing a method for manufacturing the semiconductor device of Embodiment 3 of the present invention.

A method for manufacturing the semiconductor device of Embodiment 3 and a function of dummy conductors will be described with reference to FIG. 7. FIG. 7 shows a process for forming the second interlayer insulating film 111 constituting the semiconductor device shown in FIG. 6.

First, the gate insulating film 106 is formed on the silicon substrate 101 provided with the element separations 102 and the n-well 103. Then, the gate electrode 107 is formed on the gate insulating film 106, and the side wall 108 is formed on the opposite side faces of the gate insulating film 106 and the gate electrode 107. Then, the active region 105, the source (p+) region 104*a* and the drain (p+) region 104*b* are formed by ion implantation of, for example, boron (B) ions.

Thereafter, a plasma is generated with a plasma CVD apparatus (not shown) to form the first interlayer insulating film 110. At this time, the conductor to be connected to the gate electrode 107 has not been formed yet, so that no charge current is generated by the plasma.

Then, in the first interlayer insulating film 110, which is an underlying interlayer insulating film, a contact hole so as to expose one end of the active region 105 at the bottom face, a contact hole so as to expose the other end of the active region 105 at the bottom face, and a contact hole so as to expose the gate electrode 107 at the bottom face are formed, and these contact holes are filled with tungsten to form the W plugs 109*a* to 109*c*.

Thereafter, the conductors 112*a*, 112*b* and 113 are formed simultaneously by the damascene method. More specifically, trenches are formed in the positions in which the conductors are to be provided of the underlying interlayer insulating film 110. However, it is necessary that the trenches constituting the conductor 113, which is a dummy conductor, are laid out so as not to be overlapped with the projected region 115. Then, copper layers are formed so as to fill these trenches formed in the first interlayer insulating film 110, and then excess thickness is removed by polishing by the CMP method.

Next, as shown in FIG. 7, a plasma 114 is generated with a plasma CVD apparatus (not shown) to form the second interlayer insulating film 111. At this time, in Embodiment 3, no dummy conductors are present in the projected region 115 (see FIG. 6), so that more rays in the ultraviolet region are incident on the active region 105 than in the example of FIG. 13 described in "Background Art". Therefore, the rectification property of the diode is lost significantly, and leakage current in the forward direction between the active region 105 and the n-well 103 is increased.

As a result, in Embodiment 3, even if an electric field is applied in the reverse direction, the charging current from the plasma 114 flows off to the ground potential via the protection diode, as shown by the arrow in FIG. 7. Also when the rectification property of the diode is lost significantly and an electric field is applied in the forward direction, the charging current flows off to the ground potential via the protection diode without problem.

Thus, in Embodiment 3, the charging current can flow off to the protection diode, regardless of the application direction of the electric field during the plasma process. Therefore, compared with the conventional examples, electrical stress to be applied to the gate insulating film can be reduced, and the deterioration of the device characteristics can be suppressed.

Figure 8:
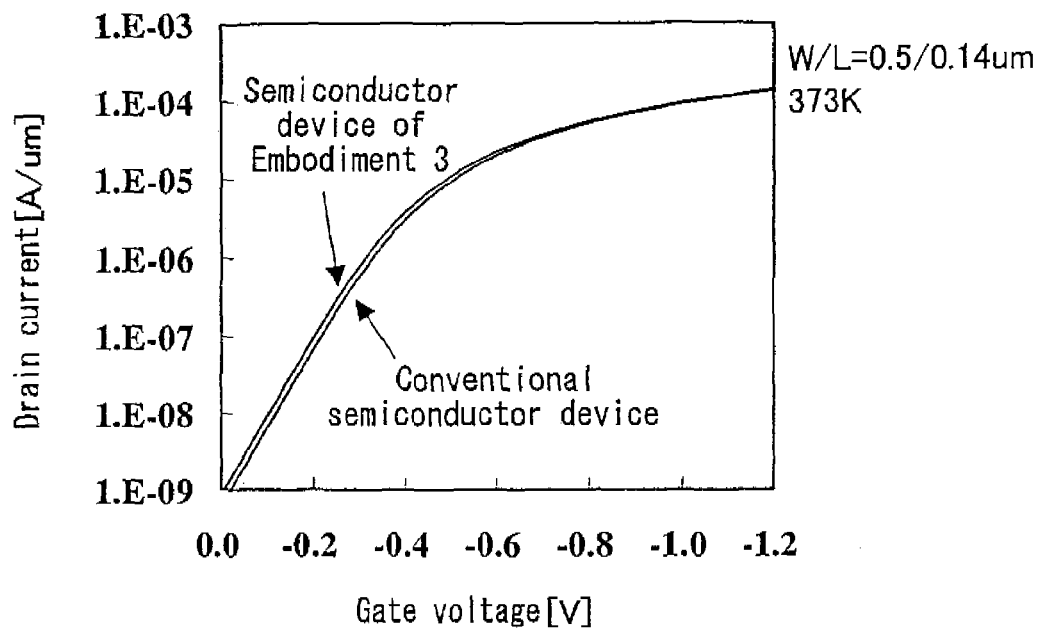
FIG. 8 is a graph showing the characteristics curve of a transistor element constituting the semiconductor device of Embodiment 3 of the present invention.
Figure 9:
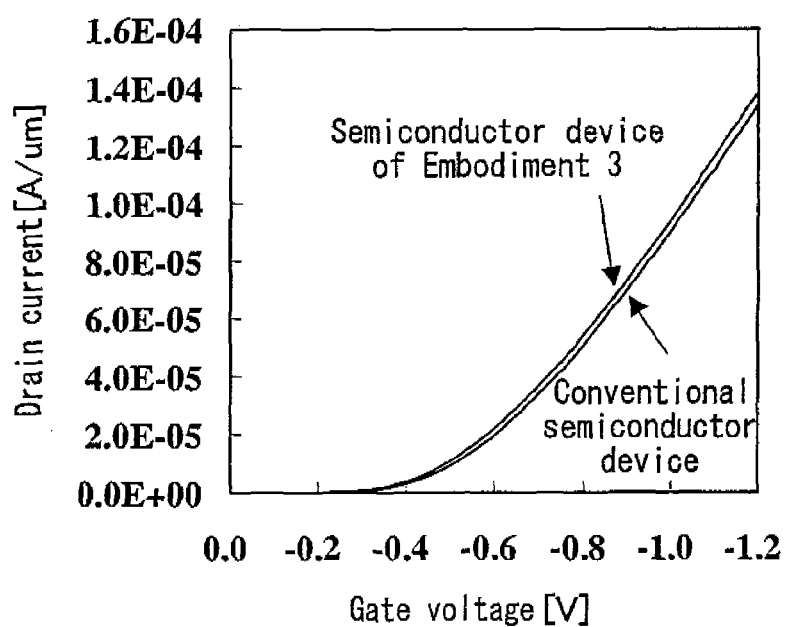
FIG. 9 is a graph showing an enlarged saturation region of the characteristics curve shown in FIG. 8.

Hereinafter, the effect of the semiconductor device and the method for manufacturing the semiconductor device of Embodiment 3 will be described with reference to FIGS. 8 and 9. The transistor element shown in FIG. 8 is a p-channel MOS transistor, as described above. In FIGS. 8 and 9, the horizontal axis shows the gate voltage, and the vertical axis shows the drain current. The drain voltage is set to 1.2 [V].

The conventional semiconductor device shown in FIGS. 8 and 9 refers to the conventional semiconductor device shown in FIG. 13, and FIGS. 8 and 9 also show the characteristics curve of the p-channel MOS transistor constituting the semiconductor device shown in FIG. 13.

As seen from FIGS. 8 and 9, in the transistor element constituting the semiconductor device of Embodiment 3, the driving ability is improved by 5% or more, compared with the transistor element constituting the conventional semiconductor device (Embodiment 3: 138 uA/um, conventional example: 134 uA/um). This indicates that according to Embodiment 3, the plasma charging damage in the gate insulating film can be suppressed, and the device characteristics can be improved.

In Embodiment 3, the semiconductor device may have a multilayer wiring structure. Furthermore, for example, as shown in FIG. 13 in "Background Art", when the conductor layer consists of two layers and it is expected that en electric field is applied in the reverse direction only during formation of the first interlayer insulating film, then the dummy conductor formed in the second interlayer insulating film can be provided in a position that is superposed on the projected region.

EMBODIMENT 4

Next, a semiconductor device and a method for manufacturing the semiconductor device of Embodiment 4 of the present invention will be described with reference to FIG. 10. In FIG. 10, the portion denoted by the same reference numeral as in FIG. 6 is the same portion as in FIG. 6.

Figure 10A:
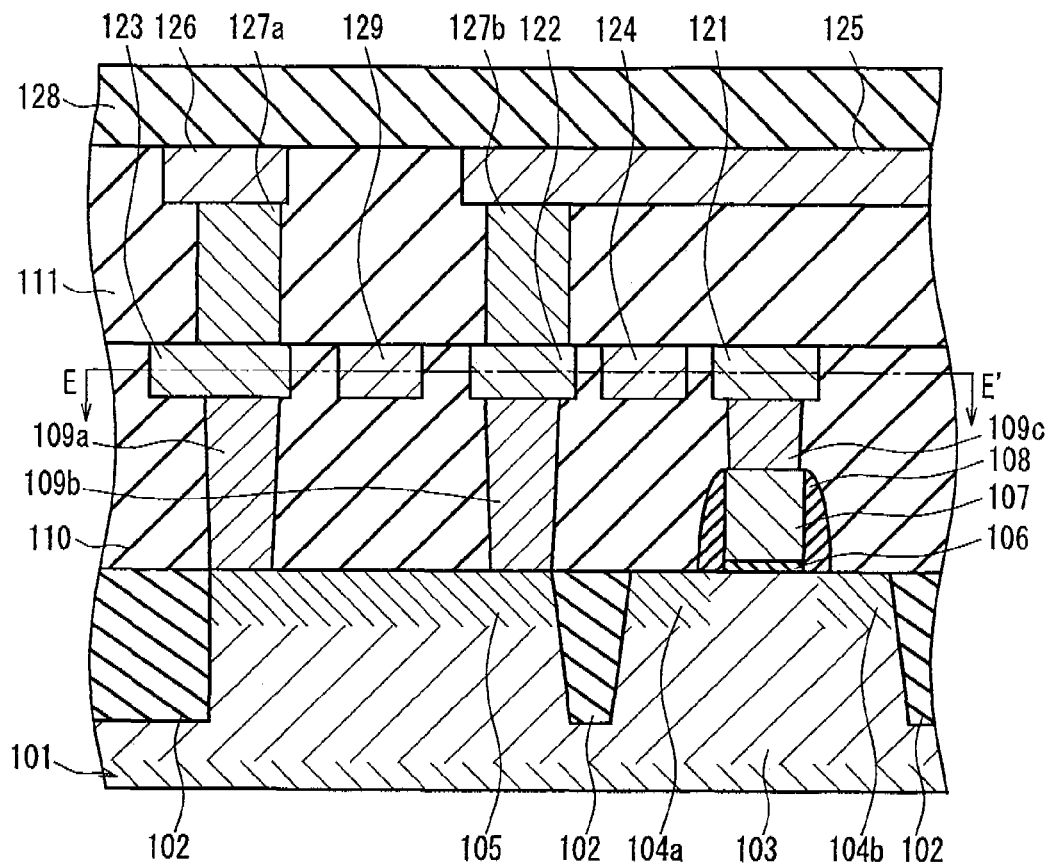
FIG. 10A is a cross-sectional view taken along the normal direction of a semiconductor substrate constituting the semiconductor device.
Figure 10B:
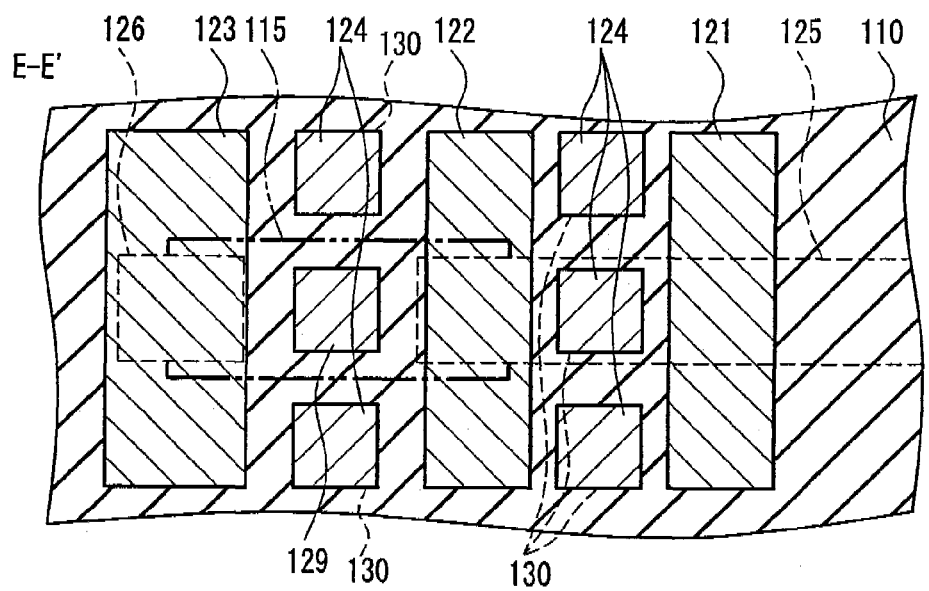
FIG. 10B is a cross-sectional view taken along a line E-E' shown in FIG. 10A.

As shown in FIGS. 10A and 10B, also in the semiconductor device of Embodiment 4, conductors 121 to 124 and 129 are provided in the first interlayer insulating film 110 by the damascene method. The conductors 124 and 129 are dummy conductors similar to the conductor 113 shown in FIG. 6 in Embodiment 3 and formed in a square shape. The conductors 121, 122 and 123 are non-dummy conductors similar to the conductors 112a and 112b shown in FIG. 6 in Embodiment 3 and formed in a strip shape, as in Embodiment 3.

However, in Embodiment 4, unlike in Embodiment 3, the conductor 129 of the dummy conductors is formed so as to be overlapped with the projected region 115. Therefore, during formation of a second insulating film 111 and a third interlayer insulating film 128 by a plasma process, a part of the rays directed toward the protection diode of the light in the ultraviolet region radiated from the plasma is absorbed by the conductor 129 as in the semiconductor device described with reference to FIG. 13 in the "Background Art".

The layout of the conductors 121, 122 and 123 is different from that in Embodiment 3. The conductor 123 is connected to the active region 105 via the W plug 109a, and the conductor 122 is connected to the active region 105 via the W plug 109b. The conductor 121 is connected to the gate electrode 107 via the W plug 109c.

On the other hand, in Embodiment 4, conductors 125 and 126, which are non-dummy conductors, and a conductor 130, which is a dummy conductor, also are formed in the second interlayer insulating film 111, and thus a multilayer wiring structure is constituted. Furthermore, a third interlayer insulating film 128 is formed on the top of the second interlayer insulating film 111 by a plasma process. The conductor 126 is connected to the conductor 123 via the W plug 127a, and the conductor 125 is connected to the conductor 122 via the W plug 127b.

Furthermore, the conductor 130, which is a dummy conductor, is provided immediately above the conductor 124 that is not overlapped with the projected region 115 as shown in FIG. 10B. In other words, the conductor 130 is provided so as not to be overlapped with a region (not shown) obtained by projecting the active region 105 on the second interlayer insulating film 111 along the normal direction of the silicon substrate 101.

Therefore, in Embodiment 4, unlike the example described with reference to FIG. 13 in "Background Art", no rays in the ultraviolet region directed toward the active region 105 during formation of the third interlayer insulating film 128 are absorbed by the dummy conductor (conductor 130) formed in the second interlayer insulating film 111. Therefore, more rays in the ultraviolet region are incident on the active region 105 during formation of the third interlayer insulating film 128, and the electrical stress applied to the gate insulating film 106 is smaller than that in the example of FIG. 13 shown in "Background Art".

Therefore, in Embodiment 4, even if an electric field is applied in the reverse direction both during formation of the second interlayer insulating film 111 and during forming of the third interlayer insulating film 128, the total electrical stress applied to the gate insulating film 106 by the time of completion of the semiconductor device is smaller than that of the example of FIG. 13 shown in "Background Art", and the deterioration of the device characteristics is smaller.

In the production of a semiconductor device having a multilayer wiring structure, when any of the dummy conductors is formed so as not to be overlapped with the projected region while assuming that charging damage occurs during the formation of an interlayer insulating film that covers a conductor positioned above this dummy conductor, mask data for forming the conductor or man-hours for checking the design rule is increased. Therefore, the semiconductor device and the method for manufacturing the semiconductor device of Embodiment 4 is advantageous especially when the direction in which en electric field is applied to form the third interlayer insulating film as shown in FIG. 10 is reversed or likely to be reversed.

Embodiments 3 and 4 are not limited to the examples shown in FIGS. 6 to 10. In the examples shown in FIGS. 6 to 10, the case where conductors are provided in two underlying insulating films has been described, but Embodiment 4 is not limited thereto, and the number of interlayer insulating films in which conductors are provided may be 3 or more. In this case, only dummy conductors immediately below the interlayer insulating film in which charging damage seems to occur may be formed so as not to be overlapped with the projected region.

In Embodiments 1 to 4, in order to increase the effect in the CMP process or facilitate setting up a design rule, the shape of the dummy conductor is square. However, in the present invention, there is no particular limitation regarding the shape of the dummy conductor.

In Embodiments 1 to 4, for connection between the dummy conductors and the active region or connection between the conductor for gate electrode connection and the gate electrode or the like, W plugs are used. However, the present invention is not limited to this example, and Cu plugs can be used in the present invention. Furthermore, in the present invention, instead of providing such a plug, a dual damascene structure can be constituted.

In Embodiments 1 to 4, the conductors are copper conductors, but the present invention is not limited to thereto. In the present invention, any conductor can be used, as long as they are formed of metal material, and they can be Al conductors. In the case of Al conductors, the conductors can be formed by etching. In this case, the dummy conductors may be conductors for alignment to confirm alignment in lithography that is performed before etching.

Industrial Applicability

As described above, according to the semiconductor device and the method for manufacturing the semiconductor device of the present invention, charging damage that occurs when forming an interlayer insulating film by a plasma process can be suppressed by optimizing the structure of the dummy structure provided around the conductors. As a result, highly reliable semiconductor devices and method for manufacturing the same can be provided.

Furthermore, according to the semiconductor device and the method for manufacturing the semiconductor device of the present invention, charging damage can be suppressed without being influenced by the application direction of the electric field during the plasma process.

What is claimed is:

1. A semiconductor device comprising a semiconductor substrate, a gate insulating film provided on the semiconductor substrate, a gate electrode provided on the gate insulating film, an insulating layer covering the gate insulating film and the gate electrode, and conductors provided in the insulating layer, wherein the conductors have a gate electrode connection plug, conductor for a gate electrode, a dummy plug, a first dummy conductor, and a second dummy conductor, the gate electrode connection plug pierces through the insulating layer and is connected electrically to the gate electrode, the conductor for a gate electrode is connected to the gate electrode connection plug, the dummy plug pierces through the insulating layer and is connected electrically to an active region formed in the semiconductor substrate, the first dummy conductor is connected to the dummy plug, and the second dummy conductor is insulated by the insulating layer at its entire circumference, the first dummy conductor is positioned adjacent to the conductor for a gate electrode, and the second dummy conductor is constituted by a plurality of conductors, and the plurality of conductors constituting the second dummy conductor are arranged so as to surround the first dummy conductor on a side that is not adjacent to the conductor for a gate electrode of the dummy conductor.

2. The semiconductor device according to claim 1, wherein the active region to which the first dummy conductor is connected is an active region that does not serve as either a source region or a drain region.

3. The semiconductor device according to claim 1, wherein the conductor for a gate electrode, the first dummy conductor and the second dummy conductor are formed by a damascene method, and the active region to which the dummy plug is connected is provided, spaced by an element separation, in a position adjacent to. a region of the semiconductor substrate in which the gate insulating film is provided.

4. The semiconductor device according to claim 2, wherein an active region that serves as a source region or a drain region is formed on the semiconductor substrate, the conductors further have a source and drain connection plug and a conductor for source and drain connection, the source and drain connection plug pierces through the insulating layer and is connected electrically to the active region that serves as a source region or a drain region, and the conductor for source and drain connection is embedded in an upper portion of the insulating layer and connected to the source and drain connection plug.

5. The semiconductor device according to claim 1, wherein the conductor for a gate electrode, the first dummy conductor and the second dummy conductor are formed of a same metal material.

6. The semiconductor device according to claim 5, wherein the metal material is a metal material containing copper.

* * * * *